(12) United States Patent
Ohkubo et al.

(10) Patent No.: US 6,545,360 B1
(45) Date of Patent: *Apr. 8, 2003

(54) SEMICONDUCTOR DEVICE AND MANUFACTURING METHOD THEREOF

(75) Inventors: Hiroaki Ohkubo, Tokyo (JP); Takehiko Hamada, Tokyo (JP); Takeo Matsuki, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/657,839

(22) Filed: Sep. 7, 2000

(30) Foreign Application Priority Data

Sep. 7, 1999 (JP) .............................. 11-252827
Jun. 2, 2000 (JP) ........................ 2000-166234

(51) Int. Cl.[7] ............................................ H01L 21/469
(52) U.S. Cl. ........................ 257/758; 438/622; 257/774
(58) Field of Search ................. 438/622, 624, 438/639, 758; 257/774, 758

(56) References Cited

U.S. PATENT DOCUMENTS

| 5,489,548 A |   | 2/1996 | Nishioka et al. |
|---|---|---|---|
| 6,136,696 A | * | 10/2000 | Horiba ........................ 438/639 |
| 6,333,538 B1 | * | 12/2001 | Hosotani et al. ............ 257/311 |
| 6,448,618 B1 |   | 9/2002 | Inaba et al. |

FOREIGN PATENT DOCUMENTS

JP          1998-071734         10/1998

* cited by examiner

Primary Examiner—David Nelms
Assistant Examiner—Renee' R Berry
(74) Attorney, Agent, or Firm—Foley & Lardner

(57) ABSTRACT

The interval between gate electrodes in a memory cell portion and the interval between gate electrodes in a peripheral circuit portion are set so as to have a relation with the widths of sidewall insulating films of the gate electrodes. Using an etching stopper film, first only a memory cell contact hole is selectively formed and a silicon film is filled at the bottom. As a result, an optimum electrode structure can be each provided on an n type diffusion layer in the memory cell portion and an n type diffusion layer in the peripheral circuit portion.

17 Claims, 8 Drawing Sheets

SEMICONDUCTOR DEVICE AND MANUFACTURING METHOD THEREOF

BACKGROUND OF THE INVENTION

1. Field of the Invention

The present invention relates to semiconductor device having a memory cell portion and manufacturing method thereof, and more particularly, to a semiconductor device directed to lowering of the resistance of the connection portion of a field effect transistor and a manufacturing method thereof.

2. Description of the Related Art

Semiconductor devices using a MOS (Metal Oxide Semiconductor) field effect transistor have been developed in various fields and implemented as a device having multiple functions as the technique of reducing the size and the technique of high density integration have advanced. As a typical semiconductor device having multiple functions, a semiconductor device including both a DRAM (Dynamic Random Access Memory) and a logic is known. Disadvantages associated with the multiple function semiconductor device will be now described.

FIGS. 1A and 1B are cross sectional views showing the memory cell portion and peripheral circuit portion of a conventional DRAM. As shown in FIGS. 1A and 1B, in the peripheral circuit portion, a MOS transistor having an n type diffusion layer and a p type diffusion layer is formed. As shown in FIG. 1A, a p well 242 is formed on the surface of a semiconductor substrate 241, and a plurality of element isolation oxide films 243 are formed on the surface of the p well 242. Thus, a memory cell portion 260 and a peripheral circuit portion 270 are partitioned and there are a plurality of element regions in the memory cell portion 260 and the peripheral circuit portion 270. At the surface of the p Well 242 in an element region in the memory cell portion 260, an n type diffusion layer 244 is formed. At the surface of the p well 242 in an element region in the peripheral circuit portion 270, an n type diffusion layer 274 is formed. The n type diffusion layer 274 in the peripheral circuit portion 270 is formed to a position deeper than the n type diffusion layer 244 in the memory cell portion 260. An interlayer insulating film 246 is formed at the upper surfaces of these element regions. In the interlayer insulating film 246, there is a memory cell portion contact 247 connected to the n type diffusion layer 244 and filled with a phosphorus-doped polysilicon plug 250 formed of a phosphorus-doped polysilicon film. Also in the interlayer insulating film 246, there is a peripheral circuit portion contact 248 connected to the n type diffusion layer 274 in the peripheral circuit portion 270, and a phosphorus-doped polysilicon plug 251 formed in the same process is filled therein. A metal interconnection 255 connected to these phosphorus-doped polysilicon plugs 250 and 251 is also formed.

In FIG. 1B, a p type diffusion layer 245 is formed on the surface of the p well 242 in the peripheral circuit portion 270. An interlayer insulating film 266 is formed on the interlayer insulating film 246 and the metal interconnection 255. A peripheral circuit portion contact 258 reaching the p type diffusion layer 245 is formed in the interlayer insulating films 266 and 246, and a metal plug 254 is filled therein. A metal plug 256 connected to the metal interconnection 255 is formed in the interlayer insulating film 266. Similarly to FIG. 1A, in the memory cell portion 260, a phosphorus-doped polysilicon plug 250 is filled in the memory cell contact portion 247 provided in the interlayer insulating film 246, and is connected to the n type diffusion layer 244.

The phosphorus-doped polysilicon plug 250 normally has the same conductivity type as that of the n type diffusion layer 244. As a result, when an n type polysilicon plug of the same conductivity type as the polysilicon plug in the memory cell portion 260 is formed in the peripheral circuit portion contact 258 on the p type diffusion layer 245 in the peripheral circuit portion 270, a pn junction forms and application of a voltage across the region between the n type polysilicon plug and the p type diffusion layer causes an undesirable rectifying effect therebetween. Therefore, an n type polysilicon plug cannot be used for the peripheral circuit portion contact 258, and a metal plug is used instead. Thus, the p type diffusion layer 245 in the peripheral circuit portion is connected to the upper metal film interconnection 265 through the metal plug 254 filling the peripheral circuit portion contact 258 and then connected to the metal interconnection 255 through the metal plug 256 provided in the interlayer insulating film 266.

Note however that as the size of a memory cell portion contact is reduced with reduction in the size of elements, the resistance of the n type polysilicon plug increases, which could cause a fault in the operation of cells. A metal plug may be used instead of the n type polysilicon plug for the contact of the memory cell portion, but the use of the metal plug increases diffusion layer leakage. As a result, a metal plug cannot be used for forming the memory cell portion contact unlike for the peripheral circuit portion contact.

SUMMARY OF THE INVENTION

It is an object of the present invention to provide a multifunction semiconductor device including memory cells with a reduced size, having a low resistance contact plug without diffusion layer leakage in the memory cell portion and a low resistance contact plug in the peripheral circuit portion of the memory cell portion.

A semiconductor device according to a first aspect of the present invention includes: semiconductor substrate; an element formed on said substrate; an interlayer insulating film formed on said semiconductor substrate; a first opening provided in said interlayer insulating film and reaching the surface of said semiconductor substrate; a second opening having a larger opening size than the first opening; a first plug having a lower conductive silicon film filled within a lower portion of said first opening and a metal film filled within an upper portion of said first opening; and a conductive, second plug filled within said second opening.

A semiconductor device according to a second aspect of the present invention includes: a semiconductor substrate; an element formed on said substrate; a gate insulating film formed on said semiconductor substrate; first and second gate electrodes formed on said gate insulating film; a sidewall insulating film formed on a sidewall of said gate electrode; an interlayer insulating film covering an upper surface of said semiconductor substrate including said gate electrode and said sidewall insulating film; first and second openings provided in said interlayer insulating film and reaching the surface of said semiconductor substrate; and conductive, first and second plugs filled within said first and second openings, respectively, said first gate electrode being formed at a first interval smaller than twice the thickness of said sidewall insulating film, and said second gate electrode being formed at a second interval larger than twice the thickness of said sidewall insulating film.

In the semiconductor devices according to the first and second aspect of the present invention, the first plug has a conductive silicon film filled within a lower layer portion of the first opening and the plug upper layer metal film filled within an upper layer and the second plug has conductive film filled within the second opening and can be directly connected to a diffusion layer. Therefore, the resistance of second plug reduced. In addition the device will not degrade the leakage characteristic in the first plug formed in a memory cell.

A method of manufacturing the semiconductor device according to a first aspect of the present invention includes the steps of: forming first and second diffusion layers on a surface of a semiconductor substrate; forming an interlayer insulating film on said semiconductor substrate including said first and second diffusion layers; forming first and second openings in a region of the interlayer insulating film on said first diffusion layer and a region of the interlayer insulating film on said second diffusion layer, respectively to expose surfaces of said first and second diffusion layers; depositing a conductive silicon film on said semiconductor substrate; etching back said conductive silicon film to form a lower portion of a first plug in a lower portion of said first opening while at the same time removing the conductive silicon film at the bottom of said second opening to expose a surface of said second diffusion layer; and depositing a metal film on said semiconductor substrate including said first and second openings, filling said first and second openings with said metal film to form an upper portion of said first plug on said lower conductive silicon plug in said first opening while at the time forming a second plug by said metal film filling within said second opening with the sidewall conductive silicon film.

A method of manufacturing the semiconductor device according to a second aspect of the present invention includes the steps of: forming first and second diffusion layers on a surface of a semiconductor substrate; forming an interlayer insulating film on said semiconductor substrate including said first and second diffusion layers; forming a first opening in a region of the interlayer insulating film on said first diffusion layer to expose a surface of said first diffusion layer; depositing a conductive silicon film to fill a lower portion of said first opening with said conductive silicon film, thereby forming a lower portion of a first plug; depositing an upper metal film to fill an upper portion of said first opening with said upper metal film, thereby forming an upper portion of said first plug; forming a second opening in a region of the interlayer insulating film on said second diffusion layer to expose a surface of said second diffusion layer; and depositing a metal film on said semiconductor substrate including said second opening to fill said second opening with said metal film, thereby forming a second plug.

A method of manufacturing the semiconductor device according to a third aspect of the present invention includes the steps of: forming first and second diffusion layers on a surface of a semiconductor substrate; forming an interlayer insulating film on said semiconductor substrate including said first and second diffusion layers; forming first and second openings in a regions in the interlayer insulating film on said first and second diffusion layers, respectively and exposing only a surface of said first diffusion layer; depositing a conductive silicon film to fill a lower portion of said first opening with the conductive silicon film, thereby forming a lower portion of a first plug; exposing a surface of said second diffusion layer at the bottom of said second opening; and depositing a metal film on said semiconductor substrate including said first and second openings, filling an upper portion of said first opening with said metal film to form an upper portion of said first plug, while at the same time filling said second opening with said metal film to form a second plug.

A method of manufacturing the semiconductor device according to a fourth aspect of the present invention includes the steps of: forming first and second gate electrodes on a semiconductor substrate, the distance between said first gate electrodes being narrow than the distance between said second gate electrodes; forming a first sidewall insulating film at sidewalls of said first and second gate electrodes; forming a first diffusion layer on said semiconductor substrate using said first gate electrode and said first sidewall insulating film as a mask and forming a second diffusion layer on said semiconductor substrate using said second gate electrode and said first sidewall insulating film as a mask; forming a second sidewall insulating film on said first sidewall insulating film; depositing an etching stopper film; forming an interlayer insulating film on said etching stopper film; etching said interlayer insulating film, said etching stopper film and said first and second sidewall insulating film so as to form a first opening in a region on said first diffusion layer exposing a surface of said first diffusion layer and a second opening in a region on said second diffusion layer exposing said etching stopper film; depositing a conductive silicon film to fill a lower portion of said first opening with the conductive silicon film, thereby forming a lower portion of a first plug; removing said etching stopper film at the bottom of said second opening to expose a surface of said second diffusion layer; and depositing a metal film on said semiconductor substrate including said first and second openings, filling an upper portion of said first opening with said metal film to form an upper portion of said first plug in said first opening while at the same time filling said second opening with said metal film to form a second plug in said second opening.

In the methods of manufacturing the semiconductor device according to the first to fourth aspect of the present invention, the conductive silicon film is any of a polysilicon film, an amorphous silicon film, an epitaxial layer, and a silicon-germanium compound crystal. If the conductive silicon film is an amorphous silicon film, the amorphous silicon film may be reformed into a polysilicon film after the first and second openings are filled with the metal film.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

Figure 1A:
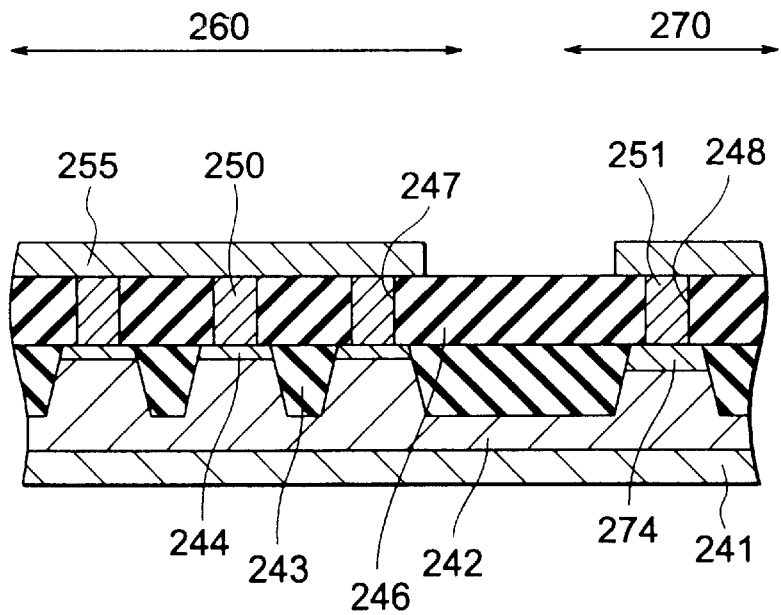
FIGS. 1A and 1B are cross sectional views of a conventional semiconductor device.
Figure 1B:
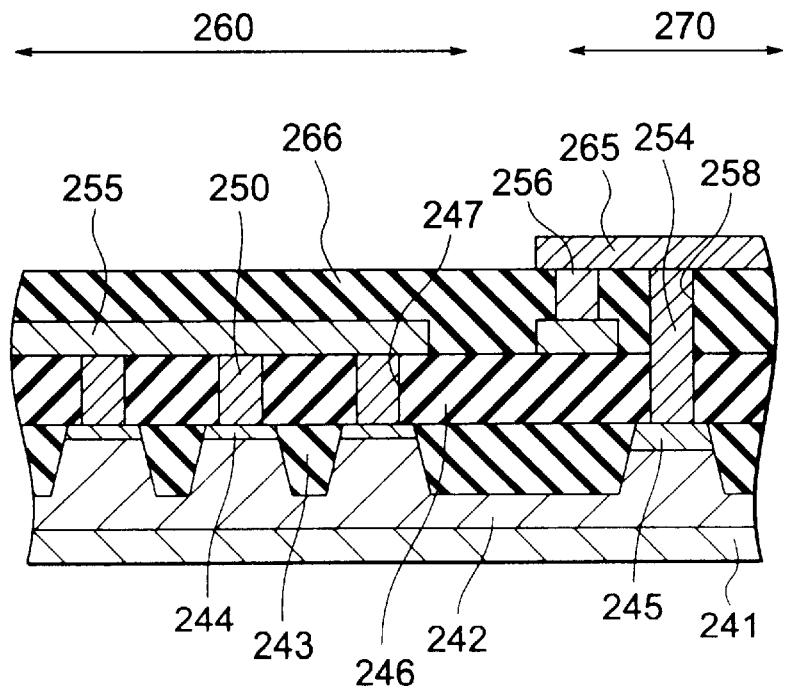

Semiconductor devices according to embodiments of the present invention and manufacturing methods thereof will be now described in detail in conjunction with the accompanying drawings. Basic features of the present invention will be described first. In a semiconductor device according to the present invention, in contact holes formed on diffusion layers in a memory cell and the peripheral circuit of the memory cell and filled with a metal film, the metal film and the diffusion layer on the substrate surface are directly connected at the bottom of the contact in the peripheral circuit portion. Meanwhile, the metal film and the diffusion layer on the substrate surface are connected through a polysilicon film at the bottom of the contact in the memory cell.

More specifically, when there are a region with a small interval between adjacent gate electrodes for example in the memory cell portion and a region with a large interval between adjacent gate electrodes for example in the peripheral circuit portion in the chip, a silicon layer is formed at the bottom in the contact hole in the region with the small interval, and a metal plug is formed both in an upper layer of the silicon layer and the contact hole in the region with the large interval.

There are roughly the following two kinds of manufacturing methods for the semiconductor device according to the present invention.

According to the first manufacturing method, when contact holes are provided in an interlayer insulating film on a substrate, a contact in a memory cell is provided in a region where a sidewall insulating film region having sidewall insulating films of adjacent gate electrodes joined with one another, a stopper nitride film, and an interlayer insulating film are formed in this order from the side of the substrate. A contact in a peripheral circuit portion is formed in a region where a stopper nitride film and an interlayer insulating film are formed in this order from the side of the substrate. In the contact in the memory cell, at the time point at which a diffusion layer is exposed, the diffusion layer is not exposed at the bottom of the contact in the peripheral circuit portion and covered with a stopper nitride film. Utilizing these different contact opening states, a conductive silicon film is selectively deposited only at the bottom of the contact in the memory cell. Then, a plug of a metal film entirely fills both contact holes.

According to the second manufacturing method, when contact holes are provided in an interlayer insulating film on a substrate, the opening width of a contact in a peripheral circuit is formed to be larger than that of a contact in a memory cell. Then, a polysilicon film deposited on the entire surface is etched back, so that a plug of the polysilicon film is formed at the bottom of the contact in the memory cell. At this time, in the contact in the peripheral circuit having the larger opening width, the polysilicon film is formed at the bottom and sidewall. Only the polysilicon film at the bottom is removed to expose a surface of the substrate at the contact bottom, and a sidewall portion is formed on the sidewall on the bottom side of the contact. Then, a plug of a metal film entirely fills the contact holes.

Regarding the sizes of the contacts in the memory cell and the peripheral circuit according to the first manufacturing method, the contact in the peripheral circuit is formed to have a larger opening width than that of the contact in the memory cell similarly to the second manufacturing method.

Figure 2A:
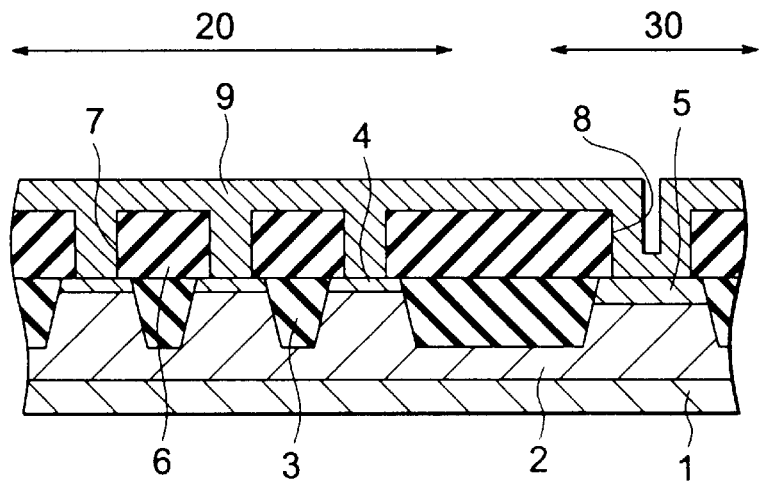
FIGS. 2A to 2C are cross sectional views showing a method of manufacturing a semiconductor device according to a first embodiment of the present invention in the order of the manufacturing steps.
Figure 2B:
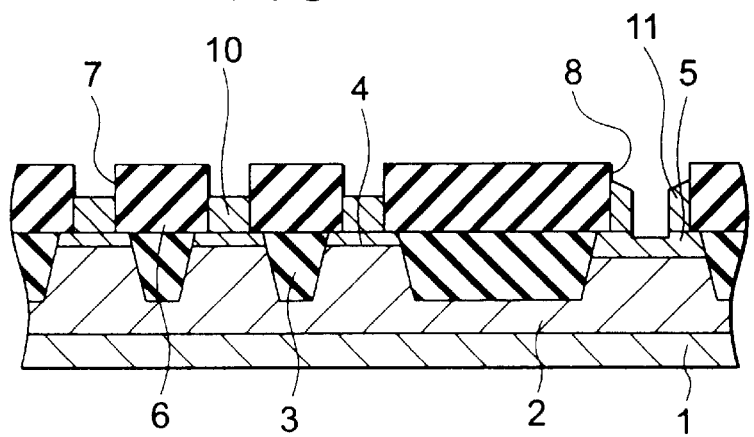
Figure 2C:
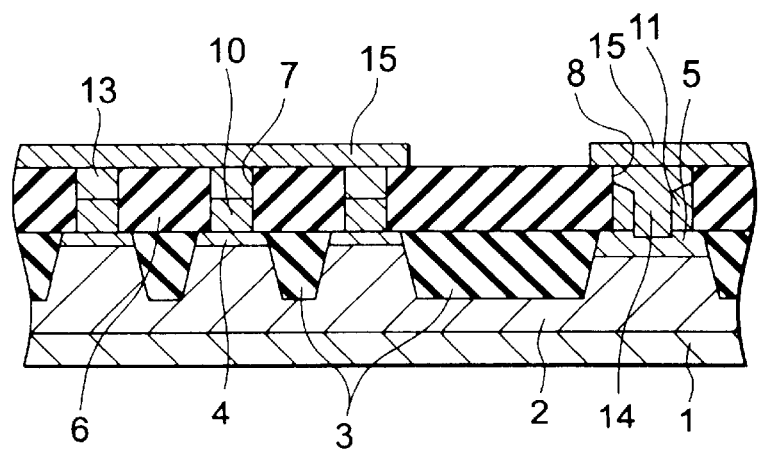

A first embodiment of the present invention will be now described. FIG. 2C is a cross sectional view of a semiconductor device according to the present embodiment. As shown in FIG. 2C, a p well 2 is formed on the surface of a silicon substrate 1. An element isolation oxide film 3 to partition a memory cell portion 20 and a peripheral circuit portion 30 and isolate elements formed in these regions is formed. In regions of the surface of the semiconductor substrate 1 in the memory cell portion 20 and the peripheral circuit portion 30 partitioned by the element isolation oxide film 3, an n type diffusion layer 4 and a p type diffusion layer 5 are formed, respectively. Note that the p type diffusion layer 5 in the peripheral circuit portion 30 is formed to a position deeper than the n type diffusion layer 4 in the memory cell portion 20. An interlayer insulating film 6 is formed on the part of the semiconductor substrate 1 where these diffusion layers are formed. In the interlayer insulating film 6, there are formed a memory cell portion contact (first opening) 7 and a peripheral circuit portion contact (second opening) 8 connected to the n type diffusion layer 4 in the memory cell portion 20 and the p type diffusion layer 5 in the peripheral circuit portion 30, respectively. A phosphorus-doped polysilicon plug (lower portion of a first plug) 10 fills a lower portion of the memory cell portion contact 7. An upper metal plug 13 fills an upper portion of the memory cell portion contact 7. A phosphorus-doped polysilicon sidewall (conductive sidewall silicon film) 11 is formed on the sidewall of the peripheral circuit portion contact 8 on the bottom side. The other region is filled with a metal plug 14. A metal interconnection 15 connected to the upper metal plug (upper portion of a first plug) 13 and the metal plug 14 is formed on the interlayer insulating film 6.

A method of manufacturing the semiconductor device according to the present embodiment will be now described. FIGS. 2A to 2C are cross sectional views showing the method of manufacturing the semiconductor device according to the present embodiment in the order of the manufacturing steps. FIG. 2A shows the memory cell portion 20 and the peripheral circuit portion 30 in the semiconductor device where the p well 2, the element isolation insulating film 3, a gate oxide film (not shown), a gate electrode (not shown), and the n type diffusion layer 4 in the memory cell portion 20 and the p type diffusion layer 5 in the peripheral circuit portion 30 to be source/drain diffusion regions have been formed on the surface of the semiconductor substrate 1. Note that the n type diffusion layer in the peripheral circuit portion 30 is not shown. The p type diffusion layer 5 and the n type diffusion layer in the peripheral circuit portion 30 are formed at a position deeper than the n type diffusion layer in the memory cell portion 20. The interlayer insulating film 6 is formed on the semiconductor substrate 1 having such elements formed thereon. Then, a memory cell portion contact 7 and a peripheral circuit portion contact 8 are formed in the interlayer insulating film 6 on the n type diffusion layer 4 and p type diffusion layer 5 in the memory cell portion 20 and the peripheral circuit portion 30, respectively to expose the diffusion layers formed on the surface of the semiconductor substrate 1. At this time, the peripheral circuit portion contact 8 is formed to have an opening width larger than that of the memory cell portion contact 7. A phosphorus-doped polysilicon (conductive silicon film) 9 is grown on the semiconductor substrate 1. The thickness of the phosphorus-doped polysilicon 9 at this time is set to be smaller than ½ the opening width of the peripheral circuit portion contact 8 and larger than ½ the opening width of the memory cell portion contact 7.

Then, as shown in FIG. 2B, the phosphorus-doped polysilicon 9 is etched back to form a phosphorus-doped polysilicon plug 10 at the bottom of the memory cell portion contact 7. At this time, the phosphorus-doped polysilicon 9 at the bottom of the peripheral circuit portion contact 8 is removed to expose a surface of the p diffusion layer 5 at the inner bottom surface of the contact. Thus, a phosphorus-doped polysilicon sidewall 11 is formed at the bottom sidewall of the peripheral circuit portion contact 8. The phosphorus-doped polysilicon 9 is set to have such a thickness to entirely fill the memory cell portion contact 7 while not entirely filling the peripheral circuit portion contact 8 but being deposited on the sidewall and the bottom surface.

As shown in FIG. 2C, a metal film 12 is deposited on the entire surface followed by etch back or CMP (Chemical Mechanical Polishing) to provide an upper metal plug 13 and a metal plug 14 in the memory cell portion contact 7 and the peripheral circuit portion contact 8, respectively. Then, a metal interconnection 15 connected to the upper metal plug 13 and the metal plug 14 is formed.

According to the present embodiment, using the difference between the opening widths of the contacts in the memory cell portion 20 and the peripheral circuit portion 30, a polysilicon film plug can be formed only at the bottom of the memory cell portion contact 7. The peripheral circuit portion contact 8 can be directly connected to the p type diffusion layer 5 and the n type diffusion layer by the metal film plug 14. Therefore, the contacts can be formed on the n type diffusion layer 4 in the memory cell portion 20, and on the n type and p type diffusion layers in the peripheral circuit portion 30 while at the same time a conductive material can be filled within the contacts in a series of process steps without additional lithography steps. In addition, while the resistance of the memory cell portion contact 7 is reduced, the manufacturing process can be simplified. The arrangement of interconnections in the peripheral circuit portion 30 can be also simplified, so that the restriction on size reduction in the peripheral circuit portion 30 can be removed. Furthermore, the series of process steps will not degrade the leakage characteristic in the memory cell portion contact 7.

Figure 3A:
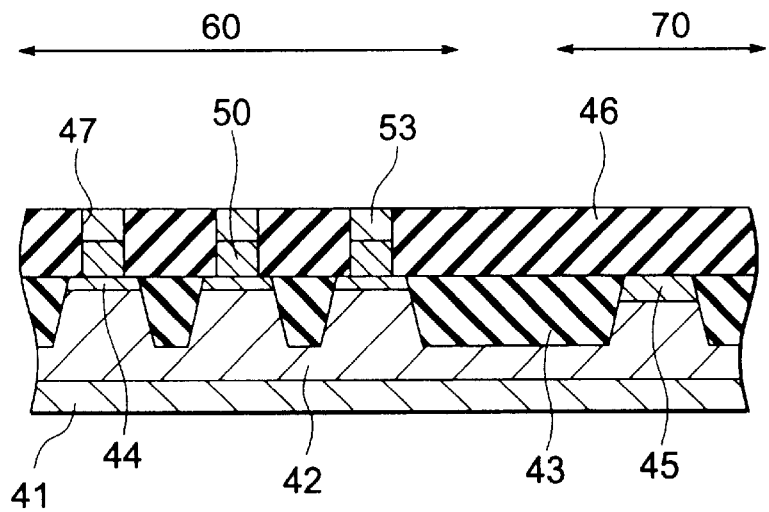
FIGS. 3A to 3C are cross sectional views showing a method of manufacturing a semiconductor device according to a second embodiment of the present invention in the order of the manufacturing steps.
Figure 3B:
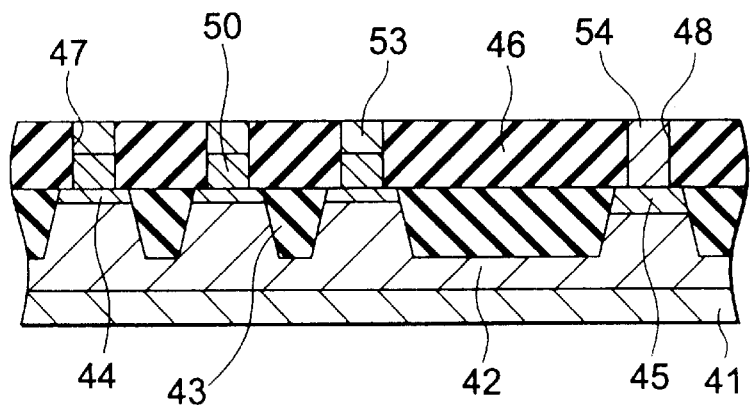
Figure 3C:
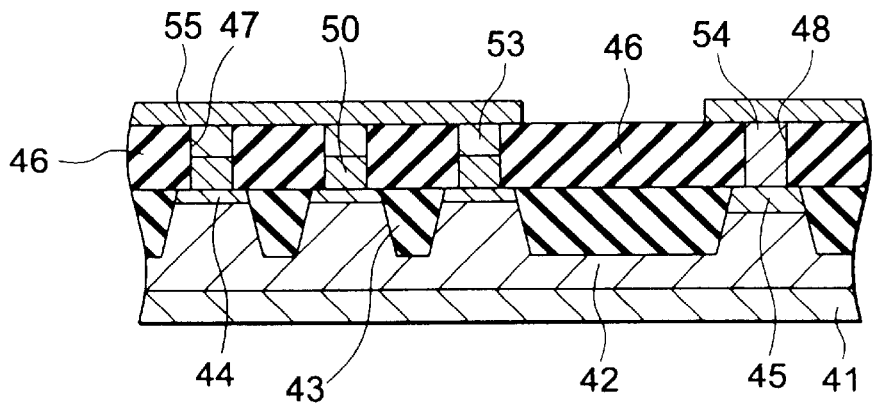

A second embodiment of the present invention will be now described. FIG. 3C is a cross sectional view of a semiconductor device according to the present embodiment. As shown in FIG. 3C, similarly to the first embodiment, formed on the surface of a semiconductor substrate 41 are a p well 42, an element isolation insulating film 43, an n type diffusion layer 44 in a memory cell portion 60, an n type diffusion layer (not shown) and a p type diffusion layer 45 in a peripheral circuit portion 70. The elements are formed in the memory cell portion 60 and the peripheral circuit portion 70. An interlayer insulating film 46 is formed on the semiconductor substrate 41 having the elements thus formed thereon, and there are a memory cell portion contact (first opening) 47 and a peripheral circuit portion contact (second opening) 48 reaching the n type diffusion layer 44 and the p type diffusion layer 45, respectively. Furthermore, the memory cell portion contact 47 is filled with a lower phosphorus-doped polysilicon plug (lower portion of a first plug) 50 and an upper metal plug (upper portion of the first plug) 53. The peripheral circuit portion contact 48 is filled with a metal plug (a second plug) 54. A metal interconnection 55 connected to the upper metal plug 53 and the metal plug 54 is formed on the interlayer insulating film 46.

A method of manufacturing the semiconductor device according to the present embodiment will be now described. FIGS. 3A to 3C are cross sectional views showing the method of manufacturing the semiconductor device according to the present embodiment in the order of the manufacturing steps. FIG. 3A shows the state after the interlayer insulating film 46 has been grown on a semiconductor substrate having a gate oxide film, a gate electrode, a source/drain diffusion layer and the like formed thereon similarly to the first embodiment. More specifically, as shown in FIG. 3A, formed on the semiconductor substrate 41 are the p well 42, the element isolation oxide film 43, the n type diffusion layer 44 in the memory cell portion 60, the p type diffusion layer 45 in the peripheral circuit portion 70 (with the n type diffusion layer in the peripheral circuit portion 70 not being shown), and the interlayer insulating film 46. The p type diffusion layer 45 and the n type diffusion layer in the peripheral circuit portion 70 are formed at positions deeper than the n type diffusion layer in the memory cell portion 60. Then, a memory cell portion contact 47 reaching the n type diffusion layer 44 is formed in the interlayer insulating film 46, and a phosphorus-doped silicon film is deposited. Then, a phosphorus-doped polysilicon plug 50 is formed at the bottom of the memory cell portion contact 47 by etch back. A metal layer is further deposited followed by etch back or CMP to form an upper metal plug 53.

As shown in FIG. 3B, a peripheral circuit portion contact 48 reaching the p type diffusion layer 45 is formed in the interlayer insulating film 46. Then, a metal film is deposited, followed by etch back or CMP to form a metal plug 54.

Then, as shown in FIG. 3C, a metal interconnection 55 connected to the upper metal plug 53 in the memory cell portion 60 and the metal plug 54 in the peripheral circuit portion 70 is formed.

In the method of manufacturing the present embodiment, the contacts in the memory cell portion 60 and the peripheral circuit portion 70 are filled with a conductive material, so that the leakage characteristic of the memory cell portion contact 47 will not be degraded. The opening width of the peripheral circuit portion contact 48 does not have to be restricted to a size larger than twice the width of the phosphorus-doped polysilicon film unlike the first embodiment, so that the size of the peripheral circuit portion 70 as well as the size of the memory cell portion 60 can be reduced.

Note that according to the present embodiment, a phosphorus polysilicon film is deposited on the memory cell portion contact 47 and etched back to form the phosphorus-doped polysilicon plug 50. However, the silicon plug may be formed by selective epitaxial growth to the memory cell portion contact 47 in place of the above method.

Figure 4:
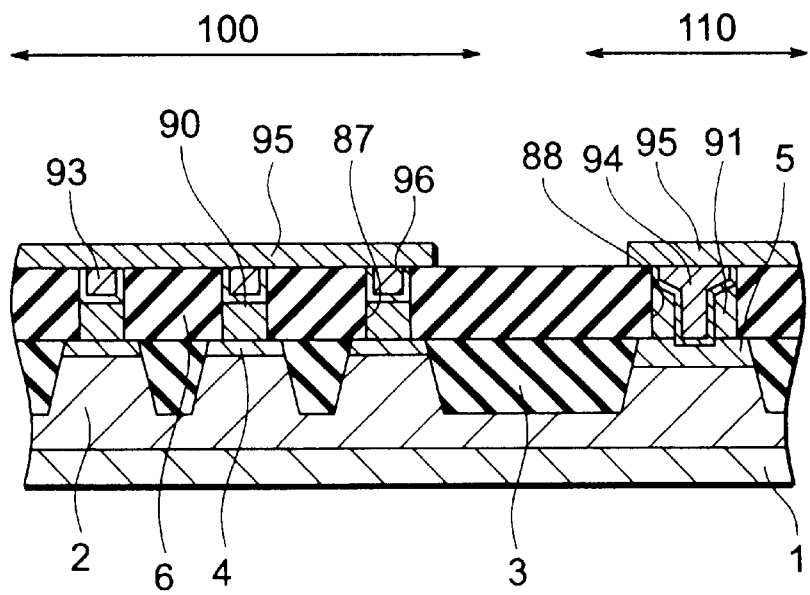
FIG. 4 is a cross sectional view of a semiconductor device according to a third embodiment of the present invention.

A third embodiment of the present invention will be now described. FIG. 4 is a cross sectional view of the semiconductor device according to the present embodiment. According to the present embodiment, a phosphorus-doped amorphous silicon film is used instead of the phosphorus-doped polysilicon film used in the first embodiment. Note that in the third embodiment shown in FIG. 4, the same elements as those in the first embodiment shown in FIG. 2 are denoted by the same reference characters and a detailed description is not provided.

As shown in FIG. 4, a memory cell portion 100 and a peripheral circuit portion 110 are formed on a semiconductor substrate 1. In an interlayer insulating film 6 for the memory cell portion 100 and the peripheral circuit portion 110, a memory cell portion contact 87 reaching an n type diffusion layer 4 and a peripheral circuit portion contact 88 reaching a p type diffusion layer 5 and an n type diffusion layer (not shown) are formed, respectively similarly to the first embodiment. Then, phosphorus-doped amorphous silicon is deposited on the semiconductor substrate 1 including these contact holes and etched back. Thus, a phosphorus-doped amorphous silicon plug (lower portion of a first plug) 90 is formed at the bottom of the memory cell portion contact (first opening) 87, and a phosphorus-doped amorphous silicon sidewall 91 is formed on the sidewall at the bottom of the peripheral circuit portion contact (second opening) 88. At this time, in the peripheral circuit portion contact portion 88, a surface of the p type diffusion layer 5 at the bottom in the contact is exposed. A metal film is then filled within the upper portion of the memory cell portion contact 87 and the peripheral circuit portion contact 88. The metal film may be a layered metal film including for example a lower layer of Ti, an upper of TiN (hereinafter referred to as TiN/Ti), barrier film 96 thereon, and a film of a refractory metal such as tungsten further thereon. After the layered metal film is deposited, etch back or CMP is performed to provide an upper metal plug 93 and a metal plug 94 in the memory cell contact 87 and the peripheral circuit portion contact 88, respectively. Then, in the memory cell portion 100, the surface of the n type diffusion layer 4 and Ti are allowed to react with one another through the phosphorus amorphous silicon plug 90 by annealing, and a Ti silicide film is formed. Similarly, in the peripheral circuit portion 110, the surface of the p type diffusion layer 5 and Ti are allowed to directly react with one another to form a Ti silicide film. Then, a metal interconnection 95 is formed and thus the metal interconnection 95 and the upper surfaces of the upper metal plug 93 and the metal plug 94 are connected.

As in the present embodiment, when a plug of an amorphous silicon film is used for a contact portion, the amorphous silicon film may be reformed into a polysilicon film having crystallinity by annealing, in other words, the amorphous silicon film may be formed into a material having lower resistance.

In this embodiment, in addition to the effects of the first embodiment, the connection resistance of the diffusion layers in the memory cell portion and the peripheral circuit portion and the metal plugs may be further reduced.

Note that in this embodiment, the phosphorus-doped amorphous silicon film, the barrier film and the refractory metal film are combined, but it should be understood that a combination of a phosphorus-doped polysilicon film, a barrier film and a refractory metal film may be employed.

Figure 5:
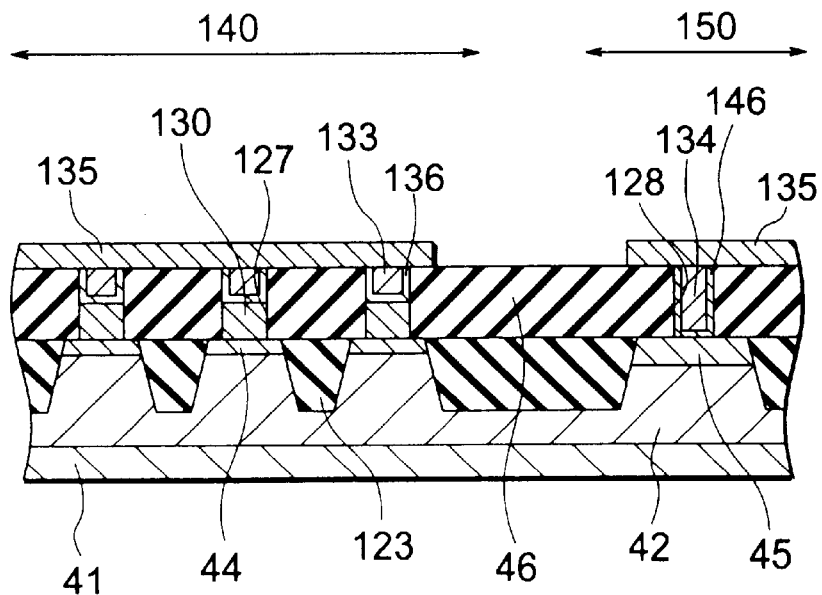
FIG. 5 is a cross sectional view of a semiconductor device according to a fourth embodiment of the present invention.

A fourth embodiment of the present invention will be now descried. FIG. 5 is a cross sectional view of a semiconductor device according to the present embodiment. In place of the phosphorus-doped polysilicon film according to the second embodiment, a phosphorus-doped amorphous silicon film is used, and a layered film of a TiN/Ti barrier film and a refractory metal film such as a tungsten film is used. Note that in the fourth embodiment shown in FIG. 5, the same elements as those in the second embodiment shown in FIG. 3 are denoted by the same reference characters and a detailed description is not provided.

As shown in FIG. 5, after a memory cell portion contact 127 reaching an n type diffusion layer 44 is formed in an interlayer insulating film 46 in a memory cell portion 140, a phosphorus-doped amorphous silicon film is deposited and etched back to form a phosphorus-doped amorphous silicon plug (lower portion of a first plug) 130 at the bottom of the memory cell portion contact (first opening) 127. Then, a TiN/Ti barrier film 136 is deposited, and then a refractory metal film such as a tungsten film is deposited on the barrier film 136. An upper metal plug 133 is formed in the memory cell portion contact 127 by etch back or CMP.

Then, a peripheral circuit portion contact (second opening) 128 reaching a p type:diffusion layer 45 and an n type diffusion layer (not shown) is formed in an interlayer insulating film 46 in a peripheral circuit portion 150. A barrier film 146 of TiN/Ti or the like is deposited, and a refractory metal film such as a tungsten film is deposited followed by etch back or CMP to form a metal plug 134 in the peripheral circuit portion contact 128. Then, in the memory cell portion 140, the surface of the n type diffusion layer 44 and Ti are allowed to react with one another through the phosphorus-doped amorphous silicon plug 130, and a Ti silicide film is formed. In the peripheral circuit portion 150, the surface of the p type diffusion layer 45 and the Ti are allowed to directly react to form a Ti silicide film. A metal interconnection 135 connected to the upper surfaces of the upper metal plug 133 and the metal plug 134 is formed on the interlayer insulating film 46.

It should be understood that though the phosphorus-doped amorphous silicon film, the barrier film and the refractory metal film are combined in the above-described case, a combination of a phosphorus-doped polysilicon film, a barrier film and a refractory metal may be employed.

Also in the present embodiment, the phosphorus-doped amorphous silicon film is deposited on the memory cell portion contact and etched back to form the phosphorus-doped amorphous silicon plug, but selective growth of phosphorus-doped epitaxy to the memory cell contact may be employed to form such a silicon plug similarly to the second embodiment.

According to the present embodiment, in addition to the effects of the second embodiment, the connection resistance of the diffusion layers in the memory cell portion 140 and the peripheral circuit portion 150 and the metal plug can be further reduced.

A fifth embodiment of the present invention will be now described. FIG. 8C is a cross sectional view of a semiconductor device according to the present embodiment. As shown in FIG. 8C, formed on the surface of a semiconductor substrate 161 are a p well 162, a memory cell portion 180, a peripheral circuit portion 190 and an element isolation insulating film 163 to isolate a plurality of elements formed in these regions. An n type diffusion layer 164, an n type diffusion layer 165 and a p type diffusion layer (not shown) are formed on the surface of the p well 162 in regions of the memory cell portion 180 and the peripheral circuit portion 190. A gate insulating film 186 is formed on the semiconductor substrate 161 in a region between these diffusion layers, and gate electrodes 181 and 182 are formed on the gate insulating film 186 in the memory cell portion 180 and the peripheral circuit portion 190, respectively. At the sidewalls of the gate electrodes 181 and 182, a first sidewall insulating film 183 and a second sidewall insulating film 184 on the outer side of the first sidewall insulating film 183 are formed. A stopper film (etching stopper film) 185 and an interlayer insulating film 166: are formed on the entire surface of the semiconductor substrate 161 having these elements formed thereon. A memory cell portion contact (first opening) 167 is formed through a sidewall interlayer insulating film on the n type diffusion layer 164 in the memory cell portion 180, the stopper film 185 and the interlayer insulating film 166. A lower portion of the contact is filled with a silicon film (lower portion of first plug) 170 and an upper portion is filled with an upper metal plug (upper portion of first plug) 173. The silicon film 170 has the same conductivity type as that of the n type diffusion layer 164 connected with the contact. The silicon film 170 is activated, and the impurity concentration of the activated silicon film 170 may be in the range from $1\times10^{18}$ to $10^{21}/CM^3$. If the concentration is low, the contact hole serves as external parasitic resistance for the source/drains of the MOSFET to which it is connected. The external parasitic resistance reduces the electric field in the source-drain region, so that the threshold voltage can be prevented from being unnecessarily lowered by the short channel effect. If the concentration is high, the resistance is lowered, and therefore the parasitic resistance described above is expected to be low.

In the peripheral circuit portion contact 190, a peripheral circuit portion contact hole (second opening) 168 is formed through the stopper film 185 and the interlayer insulating film 166 on the n type diffusion layer 165, and a metal plug (second plug) 174 is filled therein.

The metal film filled in the holes of the memory cell contact 167 and the peripheral circuit portion contact 168 is of a metal such as titanium and tantalum which reacts with silicon to form silicide and a diffusion barrier film against silicon. A metal interconnection 175 connected to the upper metal plug 173 and the metal plug 174 for connecting elements is formed on the interlayer insulating film 166.

In the present embodiment, the interval between the gate electrodes 181 formed in the memory cell portion 180 is small, while the interval between adjacent gate electrodes 182 in the peripheral circuit portion 190 is large. The device size to achieve the state can be defined by the following expressions 1 to 3:

$$d1<d2 \quad (1)$$

$$2\times d1+2\times d2>Dga \quad (2)$$

and $$2\times d2+2\times d2<Dgb \quad (3)$$

wherein the gate interval in the memory cell portion 180 is Dga, the gate interval in the peripheral circuit portion 190 is Dgb, the thickness of the first sidewall insulating film 183 (first interlayer insulating film) is d1, and the thickness of the second sidewall insulating film 184 (second interlayer insulating film) is d2.

A method of manufacturing the semiconductor device according to the present embodiment will be now described. FIGS. 6A to 6C to 8A to 8C are cross sectional views showing the method of manufacturing the semiconductor device according to the present embodiment in the order of the manufacturing steps.

Figure 6A:
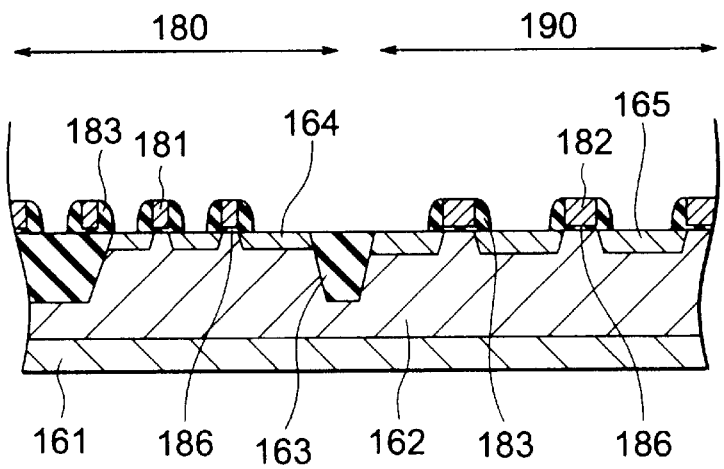
FIGS. 6A to 6C are cross sectional views showing a method of manufacturing a semiconductor device according to a fifth embodiment of the present invention in the order of the manufacturing steps.

As shown in FIG. 6A, a p well 162 is formed on the surface of an n type semiconductor substrate 161, and an element isolation insulating film 163 is formed. The element isolation insulating film 163 can be formed for example by the trench isolation technique, according to which a trench for example is formed and a silicon oxide film is filled in the trench.

Note that according to the present embodiment, the p well 162 is formed in the semiconductor substrate 161, but a p or n well may be formed as required. The well is formed by implanting an impurity by high energy ion implantation, and a desired impurity distribution is given by thermal treatment. Then, the surface of the semiconductor substrate 161 is oxidized, and a thin silicon oxide film is formed as a gate insulating film 186. The thickness of the silicon oxide film is preferably in the range from 1 to 7 nm. The gate insulating film 186 may be silicon nitride film. Furthermore, in order to set the threshold of the MOSFET, the impurity concentration at the surface of the semiconductor substrate 161 is adjusted.

A gate electrode is then formed. A polysilicon film for example is formed as the gate electrodes 181, 182 at a position on the gate insulating film 186 by a known technique. Here, the gate electrodes 181, 182 may have a layered structure including metal and polysilicon. Gate electrodes 181 formed in a memory cell portion 180 has a higher gate electrode density than gate electrodes 182 formed in a peripheral circuit portion 190. This means that if memory cells are arranged regularly like DRAM memory cells, the arrangement pitch of the gate electrodes 181 in the memory cell portion 180 is smaller than the arrangement pitch of the gate electrodes 182 in the peripheral circuit portion 190.

A first interlayer insulating film is formed on the entire surface, and the first interlayer insulating film is etched back by anisotropic dry etching to form a first sidewall insulating film 183 on the sidewalls of the gate electrodes 181 and 182. The material of the first interlayer insulating film to be the sidewall is preferably a silicon oxide film. The thickness may be 30 nm.

Then, using a resist mask, the element region for n channel transistors in the memory cell portion 180 and the peripheral circuit portion 190 is selectively implanted with n type impurity ions. In the memory cell portion 180, phosphorus ions are implanted with an energy of 7 keV, with a dose of $1\times10^{13}/cm^2$ to form the n type diffusion layer 164 to be a source/drain region of a MOSFET. Similarly, in the peripheral circuit portion 190, using a resist mask, arsenic ions is for example implanted with an energy of 10 keV, with a does of $1\times10^{14}/cm^2$ to form the n type diffusion layer 165 to be a source/drain region of a MOSFET. Note that a p channel transistor in each region may be similarly formed by implanting p type impurity ions such as $B^+$ or $BF^{2+}$ (not shown).

Figure 6B:
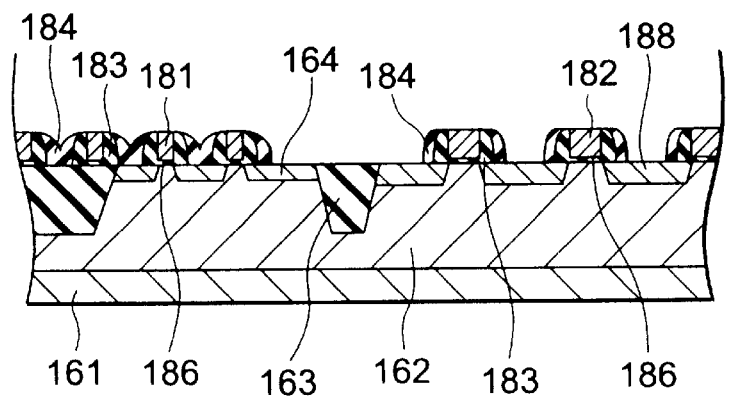

As shown in FIG. 6B, in order to form a second gate sidewall insulating film, a silicon oxide film is formed to have a thickness in the range from 20 to 100 nm. Here, the thickness is 70 nm. Subsequently, similarly to the case of forming the first sidewall insulating film 183, the silicon oxide film is etched back to form a second sidewall insulating film 184 on the outer side of the first sidewall insulating film 183. Here, in the memory cell portion 180, the second sidewall insulating film 184 still fills the region between adjacent gate electrodes 181 after the etch back step because the interval between the gate electrodes 181 is small and a sidewall will not form. Then, using a resist mask, n type impurity ions are implanted to the element region for n channel transistors in the peripheral circuit portion 190, followed by thermal treatment. Thus, an n type diffusion layer (source/drain) 188 of a high concentration is formed. The n type diffusion layer 188 may be formed for example by implanting $As^+$ ions with an implantation energy of 30 keV, with an implantation dose of $3\times10^{15}/cm^2$, followed by thermal treatment at a temperature of 750° C. in a nitrogen atmosphere.

Figure 6C:
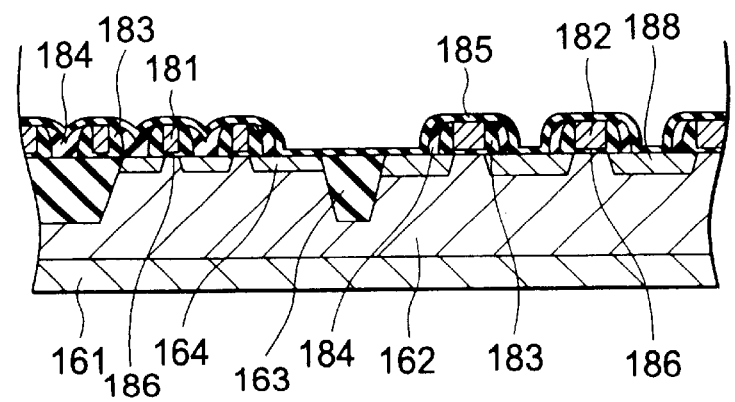

As shown in FIG. 6C, a silicon nitride film is formed as an etching stopper film 185 to have a thickness of 20 nm on the entire surface of the semiconductor substrate 161 having these elements formed thereon by low pressure CVD (Chemical Vapor Deposition). The stopper film 185 is in contact only with the upper surface of the first and second sidewall insulating films in the memory cell portion 180, while in the peripheral circuit portion 190, the film is also in contact with the semiconductor substrate 161.

Figure 7A:
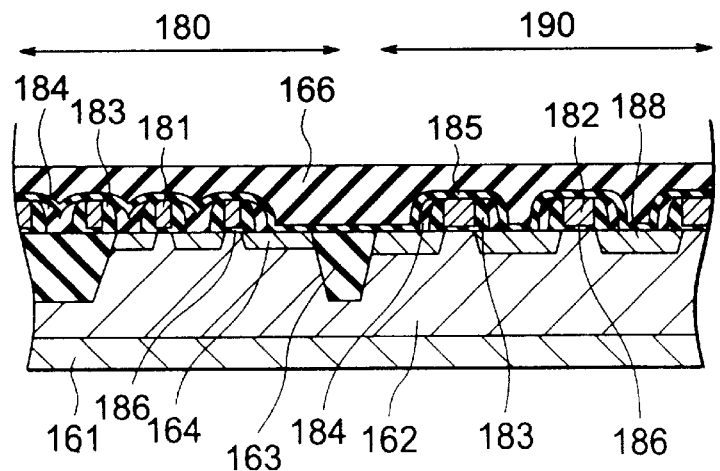
FIGS. 7A to 7C are cross sectional views showing the method of manufacturing the semiconductor device according to the fifth embodiment, showing steps following those in FIG. 6 in the order of the manufacturing steps.

As shown in FIG. 7A, a TEOS (tetraethylorthosilicate or tetraethoxysilane ($Si(OC_2H_5)_4$)) film is formed on the stopper film 185 by CVD as an interlayer insulating film 166. Then, the surface of the interlayer insulating film 166 is planarized as required. A CMP method is preferably employed therefor.

Figure 7B:
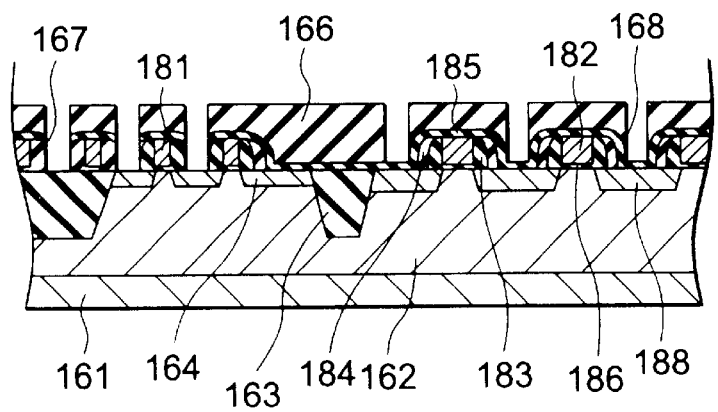

Then, as shown in FIG. 7B, a photolithography technique and a dry etching technique are combined to form a contact hole. First, by the photolithography technique, a resist mask (not shown) is formed on the interlayer insulating film 166. The contact hole size in the memory cell portion 180 is smaller than that in the peripheral circuit portion 190. The contact hole in the memory cell contact 167 may have a size of 0.1 $\mu$m for example, and the contact hole size in the peripheral circuit portion 168 may be 0.15 $\mu$m. Then, by dry etching, a contact hole is formed. The dry etching preferably includes two or more steps effective for etching. In the first step, the etching rate difference is small between the interlayer insulating film 166 and the stopper film 185 until the etching stopper film 185 in the memory cell portion 180 is penetrated through. Thus, when the stopper film 185 in the memory cell portion 180 is removed in the contact hole, the stopper film 185 and the interlayer insulating film 166 still remain in the peripheral circuit portion 190. In the second step, the interlayer insulating film 166 is etched by dry etching so that the contact hole in the memory cell portion 180 is completely open. Here, regarding the etching condition, a high selectivity ratio with the stopper film 185 is employed. When the contact hole is completely open in the memory cell portion 180, at least the stopper film 185 of the nitride film remains in the peripheral circuit portion 190.

Also as shown in FIG. 7B, the peripheral circuit portion contact 168 is formed between the gate electrodes 182 and a contact having the same shape as the peripheral circuit portion contact 168 is also formed next to gate electrodes 182 with no adjacent gate electrode 182. Thus, the peripheral circuit portion contacts 168 according to this embodiment are not necessarily limited to those formed between the gate electrodes 182.

Figure 7C:
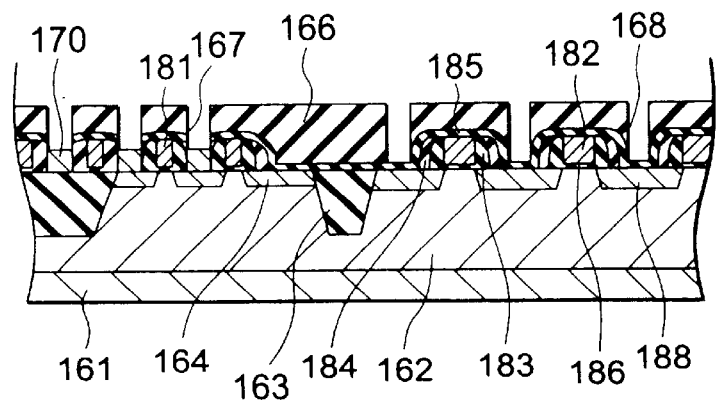

As shown in FIG. 7C, a silicon film 170 is selectively formed in the hole for the memory cell contact 167. A selective epitaxy method may be employed therefor. A fracture layer at the bottom surface of the contact formed when the memory cell portion contact 167 is formed and residue generated by the dry etching process or the like are removed away by a wet cleaning process. Immediately before a growth process, a native oxide film on the bottom surface of the contact is removed away by hydrofluoric acid. In these steps, the stopper film 185 in the peripheral circuit portion contact 168 is not removed, and therefore the semiconductor substrate 161 is not exposed at the bottom of the peripheral circuit portion contact 168. Then, a selective epitaxial growth process is performed to form a silicon film 170 having a thickness about in the range from 50 to 100 nm only in the hole for the memory cell portion contact 167.

The silicon film 170 may be compound crystal of silicon and germanium. This can reduce the contact resistance.

The silicon film 170 is implanted with an impurity as follows. In the present embodiment, an n type transistor is provided in the memory cell portion 180. Therefore, phosphorus or arsenic may be introduced during the growth of the silicon film or ions implantation may be performed after the film is formed. In the former case, compound crystal of silicon and germanium may be used to improve the activation efficiency of the impurity, which effectively reduces the plug resistance. If both p and n type devices are provided in the memory cell portion 180 and n type doping is performed during forming the silicon film, a PN junction forms between the source/drain diffusion layer of a p type transistor and the silicon film. Therefore, a silicon film not doped with an impurity is formed and then using a resist mask, the silicon film in an n type transistor is implanted with phosphorus or arsenic ions.

Figure 8A:
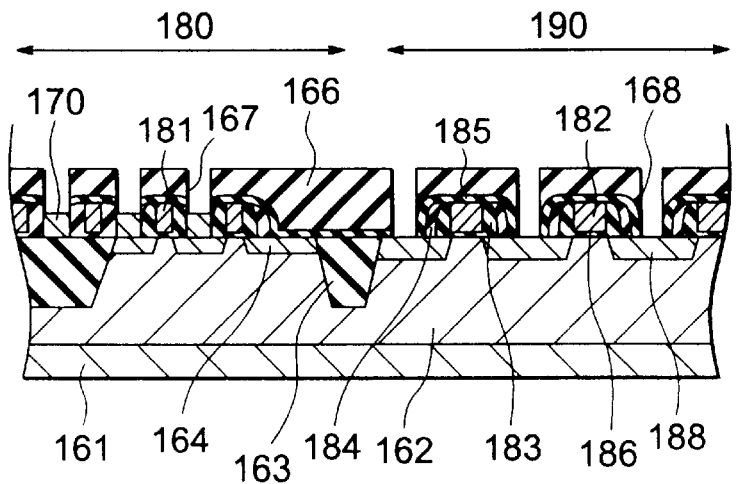
FIGS. 8A to 8C are cross sectional views showing the method of manufacturing the semiconductor device according to the fifth embodiment, showing the steps following those in FIG. 7 in the order of the manufacturing steps.

Then, as shown in FIG. 8A, the stopper film 185 remaining at the bottom of the peripheral circuit portion contact 168 is selectively removed away by dry etching. Thus, the n type diffusion layer 188 is exposed at the bottom of the peripheral circuit portion contact 168.

Figure 8B:
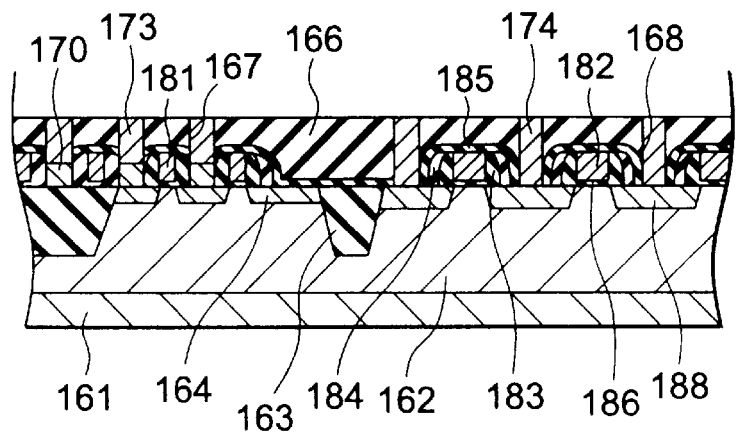
Figure 8C:
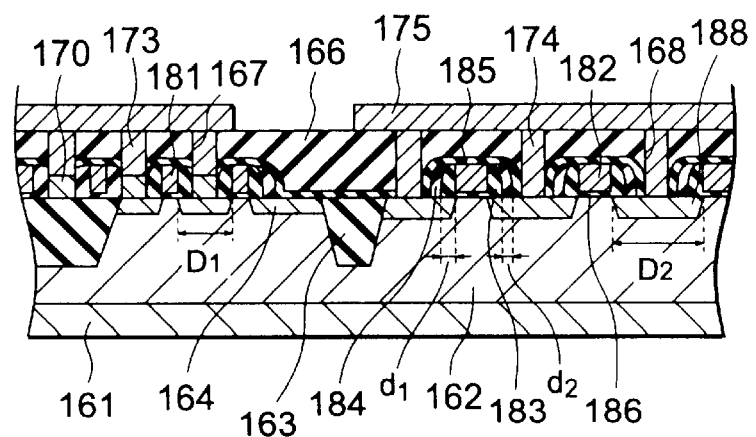

As shown in FIG. 8B, a metal plug is filled within the contact holes in the memory cell portion 180 and the peripheral circuit portion 190. A titanium film is formed in contact with the silicon, and a titanium nitride film is formed on the titanium film. This film is thermally treated at an appropriate temperature, so that the titanium reacts with the underlying silicon to form titanium silicide ($TiSi_2$). Thus, in the electrical contact characteristic, an ohmic contact results in the interface between the titanium silicide and the silicon film 170 or the n type diffusion layer 188. After the thermal treatment for silicidation reaction, a tungsten film is formed by CVD. The thickness is preferably about in the range from 400 to 500 nm. When the part of these metal films above the upper surface of the contact opening is removed by dry etching or CMP to provide the filled contact holes, an upper metal plug 173 is filled in the memory cell contact 167 on the silicon film 170. Meanwhile, a metal plug 174 is filled in the peripheral circuit portion contact 168.

Then, as shown in FIG. 8C, a titanium or titanium nitride film is formed by sputtering or CVD. Furthermore, after an aluminum film is formed, using a resist mask, the aluminum film, the titanium nitride film and the titanium film are sequentially etched to form a desired interconnection structure.

The method of manufacturing the fifth embodiment has the following effects.

1. The contact resistance can be reduced without increasing the number of exposure steps.
2. The contact resistance of a capacitance element to the substrate can be reduced.
3. When the impurity concentration of the source/drain diffusion layer in the memory cell portion is low ($n^-$ or $p^-$), the contact resistance to the diffusion layers can be reduced, while preventing current leakage from increasing.

The effects are considered to result for the following reason.

In the region such as the memory cell portion 180 with a small gate electrode interval, the space between the gate electrodes 181 is filled with the second sidewall insulating film 184. Using this characteristic,, etch back is performed at an appropriately controlled selectivity ratio, and the stopper film 185 is allowed to remain so as not to expose the semiconductor substrate 161 in the peripheral circuit portion 190. As a result, the silicon film 170 can be selectively formed only in the memory cell portion 180. The selectively formed silicon film 170 allows the diffusion layer in the memory cell portion 180 to have a low concentration. The low concentration diffusion layer is necessary for a DRAM memory cell transistor or the like. If a metal plug contact through metal silicide is formed there, current leakage increases, which increases the contact resistance. If such a selectively formed silicon film is doped in a high concentration, the characteristic of the memory cell transistor will not be damaged, and yet a metal plug contact can be formed through silicide while preventing the current leakage from increasing.

Figure 9:
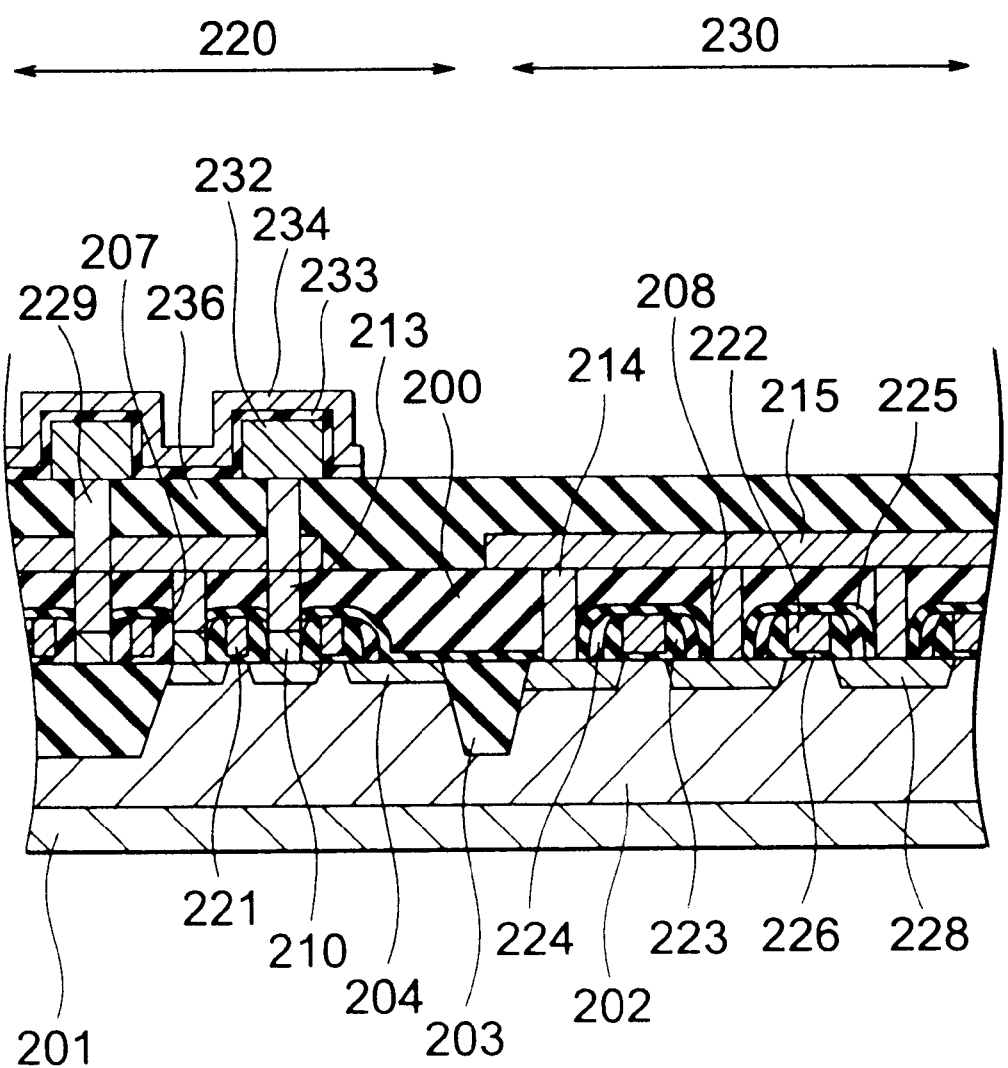
FIG. 9 is a cross sectional view of a semiconductor device according to a sixth embodiment of the present invention.

Now, a sixth embodiment of the present invention will be described. FIG. 9 is a cross sectional view of a semiconductor device according to the embodiment. Formed on a semiconductor substrate 201 are a p well 202, an element isolation insulating film 203, and n type diffusion layers 204, 228 for a MOSFET in a memory cell 220 and a peripheral circuit portion 230. Also formed on the semiconductor substrate 201 are a gate insulating film 222, gate electrodes 221 and 222 in the memory cell portion 220 and the peripheral circuit portion 230, respectively and first and second sidewall insulating films 223 and 224 on the sidewalls of the gate electrodes 221 and 222, similarly to the fifth embodiment. Further, an etching stopper film 225 and an interlayer insulating film 200 are sequentially formed thereon. Also according to the present embodiment, gate electrodes for MOSFETs are formed in a high density similarly to the memory cell portion 180 according to the fifth embodiment. The impurity concentration of the n type diffusion layer 204 to be a source/drain for a MOSFET in the memory cell portion 220 is preferably about in the range from 1 to $9 \times 10^{18}/cm^3$.

A memory cell portion contact 207 connected to the n type diffusion layer 204 is formed in the interlayer insulating film 200 on the n type diffusion layer 204, the lower portion of which is filled with a silicon film 210, and the upper portion is filled with an upper metal plug 213. Among the two n type diffusion layers 204 for the MOSFET in the memory cell portion 220, one is connected to a lower electrode 232 of a capacitive element through a capacitive plug 229. The other is connected to a metal interconnection 195. In this case, the silicon film 210 provided at the bottom of the contact is preferably doped in a high concentration. An interlayer insulating film 236 is formed on a metal interconnection 215, and the capacitive element connected to the capacitive plug :229 is formed as described above. The capacitive element includes the lower electrode 232, a capacitive insulating film 233 thereon and an upper electrode 234 thereon. The lower electrode 232 of the capacitive element may be for example of tungsten, while tantalum oxide for example may be used for the capacitive insulating film 233. Titanium nitride for example may be used for the upper electrode (plate electrode) 234.

In the interlayer insulating film 200 on the n type diffusion layer 228 in the peripheral circuit portion 230, a peripheral circuit portion contact 208 connected to the n type diffusion layer 228 is formed, into which a metal plug 214 is filled. The metal film to form:the upper metal plug 213 and the metal plug 214 to fill the contacts may be tungsten similarly to the fifth embodiment. Note that the peripheral circuit portion 230 and the n type diffusion layer 228 formed therein are the same as those in the fifth embodiment.

Also in this embodiment, using the difference in the insulating film structures of the contact openings similarly to the fifth embodiment, a polysilicon film plug is formed only at the bottom of the memory cell portion contact 207, while the peripheral circuit portion contact 208 is directly connected with the diffusion layer 228 by the metal plug 214. As a result, without additional lithography process, contact openings on the n type diffusion layer in the memory cell portion 220 and the n type and p type diffusion layers in the peripheral circuit portion 230 can be formed and a conductive material can be filled into the contacts at the same time in a series of process steps. The manufacturing steps can be simplified while the resistance of the memory cell portion contact 207 is reduced. The interconnection arrangement in the peripheral circuit portion 230 can be simplified as well, so that restriction upon size reduction in the peripheral circuit portion 230 can be removed. Furthermore, the series of process steps can be executed without degrading the leakage characteristic of the contact portion in the memory cells. In addition, in this structure, a barrier film may be placed under the metal film plug in order to further reduce the contact resistance.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A semiconductor device, comprising:

a semiconductor substrate;

an element formed on said substrate;

an interlayer insulating film formed on said semiconductor substrate;

a first opening provided in said interlayer insulating film and reaching the surface of said semiconductor substrate;

a second opening having a larger opening size than the first opening;

a first plug having a lower conductive silicon film filled within a lower portion of said first opening and a metal film filled within an upper portion of said first opening; and a conductive, second plug filled within said second opening.

2. The semiconductor device according to claim 1, wherein a source/drain diffusion region,of a memory cell is formed at a surface of said semiconductor substrate under said first opening.

3. The semiconductor device according to claim 1, wherein said first plug forms a lower electrode of a capacitor.

4. The semiconductor device according to claim 2, wherein said second plug comprises:

a conductive sidewall silicon film provided at a sidewall of said second opening; and a metallic film filled within said second opening and within said conductive sidewall silicon film.

5. The semiconductor device according to claim 2, wherein said second plug has a metallic film filled within said second opening.

6. The semiconductor device according to claim 2, wherein the second opening is filled with the same material as said metal film filled within the upper portion of said first opening.

7. The semiconductor device according to claim 4, wherein each of said metal film filled within said first opening and said metallic film filled within said second opening includes a lower barrier metal film.

8. The semiconductor device according to claim 4, wherein said lower conductive silicon film and said conductive sidewall silicon film comprise polysilicon films.

9. A semiconductor device, comprising:

a semiconductor substrate;

an element formed on said substrate;

a gate insulating film formed on said semiconductor substrate;

first and second gate electrodes formed on said gate insulating film;

a sidewall insulating film formed on a sidewall of at least one of first and second said gate electrodes;

an interlayer insulating film covering an upper surface of said semiconductor substrate including said first and second gate electrodes and said sidewall insulating film;

first and second openings provided in said interlayer insulating film and reaching the surface of said semiconductor substrate; and conductive, first and second plugs filled within said first and second openings, respectively, said first gate electrode being formed at a first interval smaller than twice the thickness of said sidewall insulating film, and said second gate electrode being formed at a second interval larger than twice the thickness of said sidewall insulating film.

10. The semiconductor device according to claim 9, wherein a source/drain diffusion region of a memory cell is formed at a surface of said semiconductor substrate under said first opening.

11. The semiconductor device according to claim 10, wherein said sidewall insulating film comprises:

a first sidewall insulating film formed on said first and second gate electrodes; and a second sidewall insulating film formed on said first sidewall insulating film and having a thickness larger than that of said first sidewall insulating film.

12. The semiconductor device according to claim 10 further comprising a plurality of first gate electrodes and a plurality o second gate electrodes and, wherein said sidewall insulating film is formed on said second gate electrodes and said first opening is formed between said first gate electrodes, and said second opening is formed in a region between opposing sidewall insulating films of said second gate electrodes neighboring each other.

13. The semiconductor device according to claim 10, further comprising an etching stopper film on said first and second gate electrodes and said sidewall insulating film, wherein at a lower side surface of said first opening, a sidewall insulating film covering said first gate electrode is exposed, and on a bottom surface of said second opening, the etching stopper film is exposed.

14. The semiconductor device according to claim 10, wherein said first plug has a lower conductive silicon film and an upper metal film lapped on said lower conductive silicon film.

15. The semiconductor device according to claim 14, wherein said upper metal film includes a lower barrier metal film.

16. The semiconductor device according to claim 14, wherein said lower conductive silicon film comprises a polysilicon film.

17. The semiconductor device according to claim 14, wherein said second plug is filled with said upper metal film filled within the upper portion of said first opening.

* * * * *